United States Patent
Kim et al.

(10) Patent No.: US 9,448,757 B2
(45) Date of Patent: Sep. 20, 2016

(54) ARRAY SUBSTRATE FOR FLEXIBLE DISPLAY DEVICE

(71) Applicant: Samsung Display Co., Ltd., Yongin (KR)

(72) Inventors: Dong-Ho Kim, Yongin (KR); Kyu-Bong Jung, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 549 days.

(21) Appl. No.: 13/747,971

(22) Filed: Jan. 23, 2013

(65) Prior Publication Data

US 2014/0098005 A1    Apr. 10, 2014

(30) Foreign Application Priority Data

Oct. 9, 2012 (KR) .......................... 10-2012-0112083

(51) Int. Cl.
| | | |
|---|---|---|
| *G09G 3/32* | (2016.01) | |
| *H01L 23/58* | (2006.01) | |
| *G06F 3/14* | (2006.01) | |
| *H01L 21/66* | (2006.01) | |

(52) U.S. Cl.
CPC ............. *G06F 3/1446* (2013.01); *H01L 22/34* (2013.01); *G09G 2300/026* (2013.01); *G09G 2380/02* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 4,481,524 A | * | 11/1984 | Tsujide .......................... | 257/369 |
| 7,968,882 B2 | | 6/2011 | Lee et al. | |
| 2005/0104516 A1 | * | 5/2005 | Park et al. ..................... | 313/512 |
| 2007/0105252 A1 | * | 5/2007 | Lee et al. ......................... | 438/26 |
| 2007/0264564 A1 | * | 11/2007 | Johnson et al. ................ | 429/161 |
| 2008/0068309 A1 | * | 3/2008 | Kwak et al. ...................... | 345/82 |
| 2009/0051010 A1 | * | 2/2009 | Zhao ....................... | H01L 21/78 |
| | | | | 257/620 |

FOREIGN PATENT DOCUMENTS

| | | | |
|---|---|---|---|
| KR | 10-2005-0039022 A | | 4/2005 |
| KR | 10-2009-0121894 A | | 11/2009 |
| KR | 10-2011-0067442 A | | 6/2011 |
| KR | 10-2011-0133881 A | | 12/2011 |

* cited by examiner

*Primary Examiner* — Christopher R Lamb
(74) *Attorney, Agent, or Firm* — Knobbe, Martens, Olson & Bear, LLP (57) ABSTRACT

In an aspect, an array substrate for a flexible display device is provided, the array substrate including: a mother substrate; a plurality of display units that are spaced apart from each other on the mother substrate, the plurality of display units each including a display region for displaying an image and a non-display region extending from the display region; a sealing unit covering the display region of each of the plurality of display units; and a plurality of test wire lines formed in a wire region between the adjacent display units on the mother substrate, that are electrically connected to each of the plurality of display units, and having a pattern.

10 Claims, 5 Drawing Sheets

ARRAY SUBSTRATE FOR FLEXIBLE DISPLAY DEVICE

CROSS-REFERENCE TO RELATED APPLICATION

This application claims priority to and the benefit of Korean Patent Application No. 10-2012-0112083, filed in the Korean Intellectual Property Office on Oct. 9, 2012, the disclosure of which is incorporated herein by reference in its entirety.

BACKGROUND

1. Field

The described technology generally relates to an array substrate, and more particularly, to a flexible display device where an edge crack of a flexible display unit is prevented.

2. Description of the Related Technology

Flat display devices are typically classified into light-emitting types and light-receiving types. Examples of a light-emitting type display device include an organic light-emitting display (OLED) device, a plasma display panel (PDP), a flat cathode ray tube (FCRT) device, a vacuum fluorescent display panel (VFD), and a light-emitting diode (LED) panel. An example of a light-receiving display device includes a liquid crystal display (LCD) panel.

An OLED device has wide viewing angles, excellent contrast, and quick response speeds, and thus, the OLED device is receiving consideration for use as a display device of a mobile terminal, such as a digital camera, a video camera, a camcorder, a mobile information terminal, a smart phone, an ultra-slim laptop, or a tablet personal computer, or application to an electronic/electric product, such as an ultra-thin TV.

Recently, flexible display devices have been studied and developed as next-generation display devices for certain applications in that they are easily carried and may be applied to devices having various shapes.

For efficiency, a flexible display device may be manufactured by forming a plurality of display units on a mother substrate and dividing the mother substrate into individual display units by using a cutting device. During manufacture a test wire line may be electrically connected to each display unit formed on the mother substrate for a lighting test of each display unit. However, an edge crack may be generated as a plurality of test wire lines are torn by force applied from the cutting device while cutting the mother substrate after the lighting test, and such an edge crack may cause shrinkage of the flexible display device.

SUMMARY

The present embodiments provide a flexible display apparatus where shrinkage incidence in a display unit is reduced by preventing an edge crack generated while cutting a plurality of display units formed on a mother substrate.

Some embodiments provide an array substrate for a flexible display device, the array substrate including: a mother substrate; a plurality of display units that are spaced apart from each other on the mother substrate, the plurality of display units each including a display region for displaying an image and a non-display region extending from the display region; a sealing unit covering the display region of each of the plurality of display units; and a plurality of test wire lines formed in a wire region between the adjacent display units on the mother substrate, that are electrically connected to each of the plurality of display units, and having a pattern. In some embodiments, the pattern is configured for preventing cracks.

In some embodiments, the plurality of test wire lines may be arranged along one direction of the mother substrate and have a mesh type pattern.

In some embodiments, a plurality of cutting lines for individually separating the plurality of display units may be formed on the mother substrate along edges of the plurality of display units, and the plurality of test wire lines may overlap the plurality of display units in the non-display regions of the plurality of display units by extending from the wire region to each of the plurality of display units, and the plurality of cutting lines may be formed in regions where the plurality of test wire lines and the plurality of display units overlap.

In some embodiments, at least one insulation layer may be formed on the mother substrate in the non-display region of each of the plurality of display units, and the plurality of cutting lines may be located on regions where at least one region of the at least one insulation layer and the plurality of test wire lines overlap.

In some embodiments, the plurality of display units may each include: a flexible substrate formed on the mother substrate; a thin film transistor formed on the flexible substrate, the thin film transistor including a semiconductor active layer, a gate electrode, source and drain electrodes, and a plurality of insulation layers insulating devices from each other; and an organic light-emitting device connected to the thin film transistor, the organic light-emitting device including a first electrode, a second electrode, and an organic film formed between the first and second electrodes.

In some embodiments, the plurality of insulation layers may each extend from the display regions of the plurality of display units where the devices are formed to the non-display regions and wire regions, and the plurality of test wire lines may be formed on the plurality of insulation layers.

In some embodiments, a plurality of cutting lines for individually separating the plurality of display units from each other may be formed on edges of the plurality of display units and the plurality of test wire lines extend from wires to the plurality of display units to overlap the plurality of display units in the non-display regions of the plurality of display units, and the plurality of cutting lines may be formed in regions where the plurality of test wire lines and the plurality of display units overlap each other.

In some embodiments, the plurality of insulation layers may each include: a first insulation layer corresponding to a buffer layer formed on the flexible substrate; a second insulation layer corresponding to a gate insulation film covering the semiconductor active layer formed on the first insulation layer; and a third insulation layer corresponding to an interlayer insulation film covering the gate electrode formed on the second insulation layer.

In some embodiments, the plurality of test wire lines may each include: a first wire line formed on the second insulation layer; and a second wire line stacked on the first wire line.

In some embodiments, the plurality of test wire lines may each include a wire line formed on the second insulation layer.

In some embodiments, the plurality of test wire lines may each include a wire line formed on the third insulation layer.

In some embodiments, the plurality of test wire lines may each include a wire line formed on the second insulation layer and in a contact hole penetrating through the third insulation layer.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION

Hereinafter, the present disclosure will be described in detail by explaining exemplary embodiments with reference to the attached drawings. However, this is not intended to limit the present embodiments to particular modes of practice, and it will to be appreciated that all changes, equivalents, and substitutes that do not depart from the spirit and technical scope of the present invention are encompassed in the present embodiments.

While such terms as "first", "second", etc., may be used to describe various components, such components must not be limited to the above terms. The above terms are used only to distinguish one component from another.

The terms used in the present specification are merely used to describe particular embodiments, and are not intended to limit the present embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

As used herein, the term "and/or" includes any and all combinations of one or more of the associated listed items.

An array substrate for a flexible display device, according to aspects of the present embodiments, will be described below in more detail with reference to the accompanying drawings. Those components that are the same or are in correspondence are rendered the same reference numeral regardless of the figure number, and redundant explanations are omitted.

Figure 1:
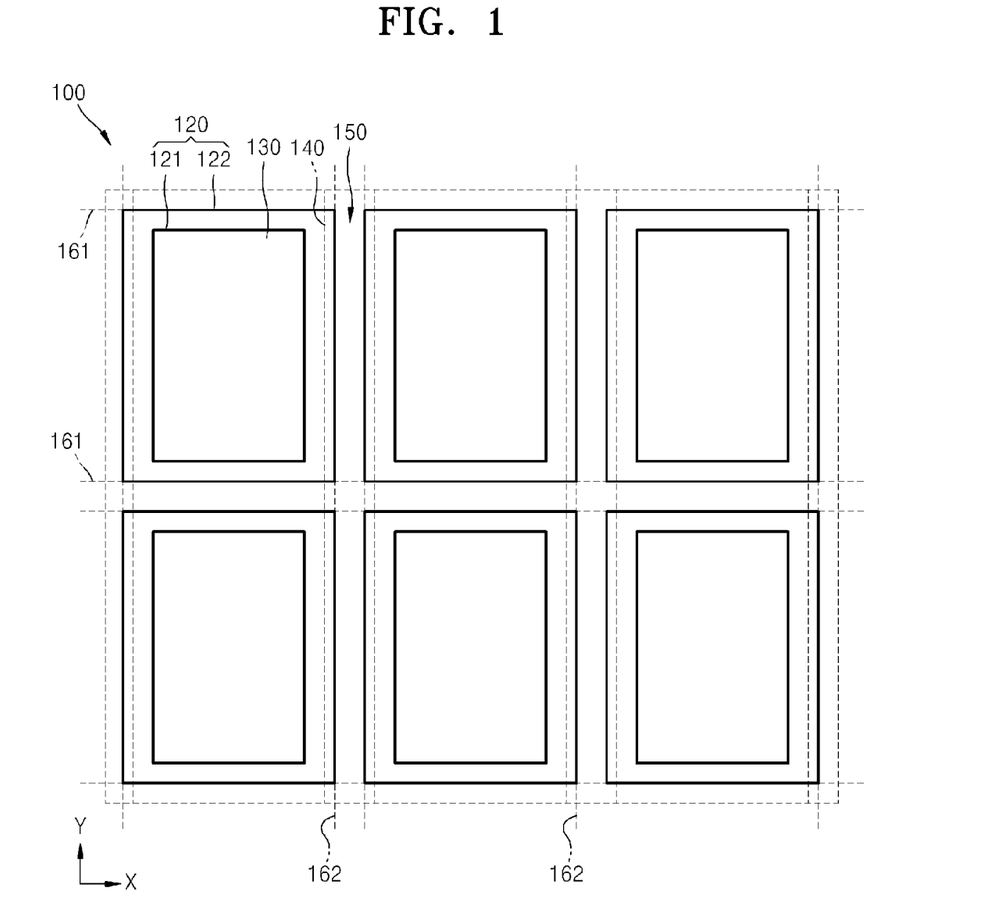
FIG. 1 is a plan view illustrating an array substrate for a flexible display device, according to an aspect of the present embodiments.

FIG. 1 is a plan view illustrating an array substrate 100 for a flexible display device, according to an aspect embodiment of the present embodiments.

Referring to FIG. 1, the array substrate 100 includes a mother substrate 110, a plurality of display units 120 formed on the mother substrate 110, a sealing unit 130 respectively formed on the display units 120, and a plurality of test wire lines 140 patterned on the mother substrate 110.

In some embodiments, the mother substrate 110 may be a flexible film, for example, a protective film formed of polymer resin. In some embodiments, the mother substrate 110 has a sufficient thickness to support a shape of the display units 120 that are thin layers. In some embodiments, the mother substrate 110 has a size for simultaneously manufacturing the plurality of display units 120.

In some embodiments, the display units 120 may be spaced apart from each other on the mother substrate 110. In some embodiments, the display units 120 may be separated from each other and each operate as a display device. In some embodiments, the display units 120 may be simultaneously formed on the mother substrate 110 and then may be separated from each other by using a cutting device.

In some embodiments, the display unit 120 may be an organic light-emitting display unit. In some embodiments, the display unit 120 may be a liquid crystal display unit, a field emission display unit, an electroluminescent display unit, or an electrophoretic display unit.

In some embodiments, the display unit 120 may include a display region 121 for realizing an image, and a non-display region 122 extending from the display region 121 to an edge of the display unit 120. A device or a thin layer formed in the display region 121 will be described in detail later with reference to FIG. 2.

In some embodiments, the sealing unit 130 may be formed on the display unit 120 to cover the display region 121. In some embodiments, the sealing unit 130 may beformed to prevent external moisture or foreign substances from penetrating into the display region 121. In some embodiments, the sealing unit 130 may be formed throughout the mother substrate 110. In some embodiments, the sealing unit 130 may be selectively formed on regions corresponding to the display units 120. In some embodiments, the sealing unit 130 may be formed via a deposition process using a deposition mask.

In some embodiments, the test wire lines 140 may be patterned on wire regions 150 between the adjacent display units 120. In some embodiments, the test wire lines 140 may be electrically connected to the display units 120, and are used to test whether the display units 120 properly operate.

In some embodiments, the test wire lines 140 may be arranged along one direction (Y-direction) of the mother substrate 110. However, the arrangement of the test wire lines 140 is not limited thereto as long as they are electrically connected to the display units 120, for example, the test wire lines 140 may be formed along an X-direction of the mother substrate 110 or formed both along the X- and Y-directions of the mother substrate 110.

Figure 2:
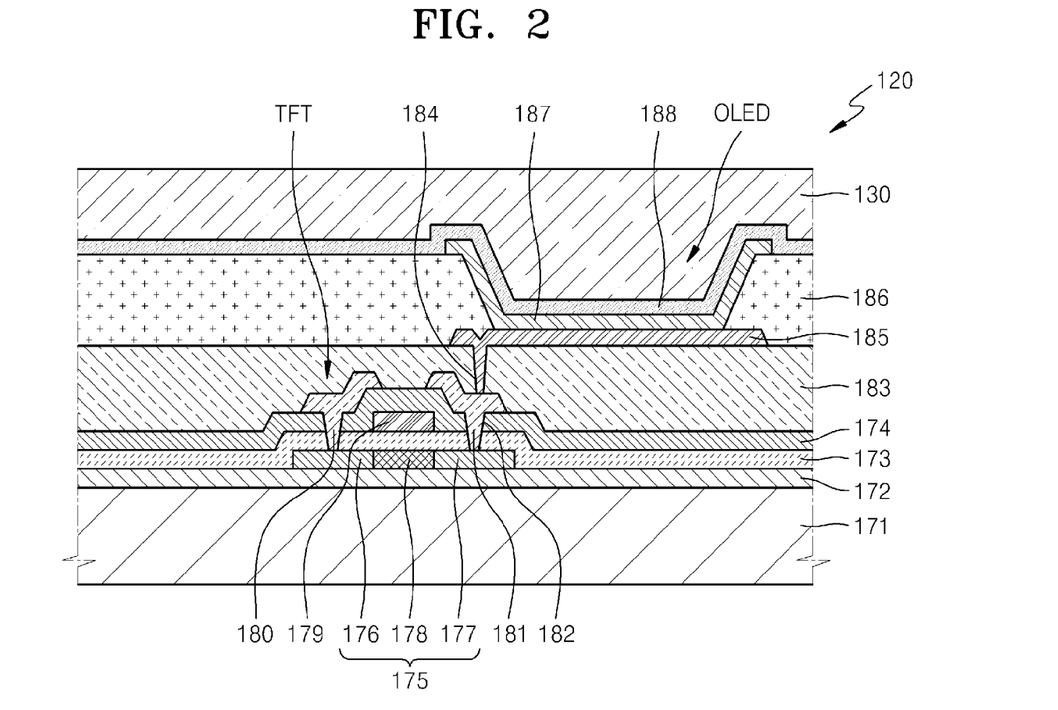
FIG. 2 is a cross-sectional view illustrating a sub-pixel of a display unit shown FIG. 1.

FIG. 2 is a cross-sectional view illustrating a sub-pixel of the display unit 120 shown FIG. 1.

Referring to FIG. 2, the display unit 120 includes a flexible substrate 171. In some embodiments, the flexible substrate 171 may be formed of a flexible material. In some embodiments, the, the flexible substrate 171 may be formed of a polymer material, such as polyimide (PI), polycarbonate (PC), polyethersulphone (PES), polyethylene terephthalate (PET), polyethylene naphthalate (PEN), polyarylate (PAR), or fiber glass reinforced plastic (FRP).

In some embodiments, the flexible substrate 171 may be formed on the mother substrate 100 of FIG. 1 via deposition. In some embodiments, the flexible substrate 171 may be a thin layer covering an entire top surface of the mother substrate 110. In some embodiments, if the flexible substrate 171 has a sufficient thickness to support weights of devices and thin layers formed thereon, the flexible substrate 171 may replace the mother substrate 110.

In some embodiments, a first insulation layer 172 corresponding to a barrier layer may be formed on the flexible substrate 171. In some embodiments, the first insulation layer 172 covers the entire flexible substrate 171. In some embodiments, the first insulation layer 171 may be formed of an inorganic material, such as silicon oxide ($SiO_x$), silicon nitride ($SiN_y$), silicon oxynitride (SiON), aluminum oxide (AlO), or aluminum nitride (AlON), an organic material, such as acryl, PI, or polyester, or both an organic material and an inorganic material that are alternately stacked on each other.

In some embodiments, the first insulation layer 172 blocks oxygen and moisture. In some embodiments, the first insulation layer 172 prevents moisture or impurities from diffusing from the flexible substrate 171 and provides an even surface on the flexible substrate 171.

In some embodiments, a thin film transistor (TFT) may be formed on the first insulation layer 172. In some embodiments, the TFT may be a top gate type TFT. In some embodiments, the TFT may be a bottom gate type TFT.

In some embodiments, a semiconductor active layer 175, a second insulation layer 173, a gate electrode 179, a third insulation layer 174, a source electrode 180, a drain electrode 181, and a protective film 183 may be formed on the first insulation layer 172 if a top gate TFT is used.

In some embodiments, the semiconductor active layer 175 may be formed by forming amorphous silicon and then crystallizing the amorphous silicon into polysilicon.

In some embodiments, the amorphous silicon may be crystallized by using any one of various methods, such as a rapid thermal annealing (RTA) method, a solid phase crystallization (SPC) method, an excimer laser annealing (ELA) method, a metal-induced crystallization (MIC) method, a metal-induced lateral crystallization (MILC) method, and a sequential lateral solidification (SLS) method, but in order to form the flexible substrate 171 according to the current embodiment, a method that does not require a high-temperature heating process may be used.

For example, when the amorphous silicon is crystallized according to a low temperature polysilicon (LTPS) method, the semiconductor active layer 175 may be activated by irradiating a laser beam for a short time so as to remove a time when the flexible substrate 171 is exposed to a high temperature equal to or higher than 300° C., and thus the LTPS method may be performed at a temperature lower than 300° C. In some embodiments, the TFT may be formed by applying the flexible substrate 171 using a polymer material.

In some embodiments, the semiconductor active layer 175 includes a source region 176 and a drain region 177 by doping N- or P-type impurity ions. In some embodiments, a channel region 178 that is not doped with an impurity may be formed between the source and drain regions 176 and 177.

In some embodiments, the second insulation layer 173 corresponding to a gate insulation film may be deposited on the semiconductor active layer 175. In some embodiments, the second insulation layer 173 may be a single layer formed of $SiO_2$ or a double layer formed of $SiO_2$ and $SiN_y$. In some embodiments, the second insulation layer 173 may be formed on a whole region of the display unit 120. In other words, the second insulation layer 173 extends to the non-display region 122 of FIG. 1. In addition, the second insulation layer 173 may extend up to the wire region 150 of FIG. 1 to be formed on the mother substrate 110 of FIG. 1.

In some embodiments, the second insulation layer 173 may be selectively formed on a desired region of the mother substrate 110.

In some embodiments, the gate electrode 179 may be formed on a predetermined region of the second insulation layer 173. In some embodiments, the gate electrode 179 may be connected to a gate line (not shown) via which a TFT on/off signal is applied. In some embodiments, the gate electrode 179 may be formed of a single or multiple metals. For example, the gate electrode 179 may include a single layer of gold (Au), silver (Ag), copper (Cu), nickel (Ni), platinum (Pt), palladium (Pd), aluminum (Al), molybdenum (Mo), or chromium (Cr), a layers thereof, or an alloy, such as Al:Nd or Mo:W.

In some embodiments, the third insulation layer 174 corresponding to an interlayer insulation film may be formed on the gate electrode 179. In some embodiments, the third insulation layer 174 may be formed of an insulation material, such as $SiO_2$ or $SiN_y$, or may be formed of an insulation organic material. The third insulation layer 174 may be formed on a whole region of the display units 120. In some embodiments, the third insulation layer 174 extends to the non-display region 122 of FIG. 1. In some embodiments, the third insulation layer 174 may extend up to the wire region 150 of FIG. 1 to be formed on the mother substrate 110 of FIG. 1. In some embodiments, the third insulation layer 174 may be selectively formed on a desired region of the mother substrate 110.

In some embodiments, in the non-display region 122 and the wire region 150, the flexible substrate 171 may be formed on another mother substrate 110, and a stacked structure of at least any one of the first insulation layer 172, the second insulation layer 173, and the third insulation layer 174 is formed on the flexible substrate 171.

In some embodiments, the source electrode 180 and the drain electrode 181 may be formed on the third insulation layer 174. In some embodiments, a contact hole 182 may be formed by selectively removing portions of the second and third insulation layers 173 and 174, and the source electrode 180 and the drain electrode 181 may be respectively electrically connected to the source region 176 and the drain region 177 through the contact hole 182.

In some embodiments, the protective film 183 (passivation film and/or planarization film) may be formed on the source and drain electrodes 180 and 181. In some embodiments, the protective film 183 protects and evens the TFT therebelow. In some embodiments, the protective film 183 may be variously modified, for example, may have any one of various shapes, may be formed of an organic material, such as benzocyclobutene (BCB) or acryl, or an inorganic material, such as $SiN_y$, or may include a single layer, a double layer, or a plurality of layers.

Some embodiments provide a display device formed on the TFT. In some embodiments, the display device includes an organic light-emitting device (OLED) device, but alternatively, any one of various display devices may be used.

In some embodiments, the first electrode 185 corresponding to a pixel electrode may be electrically connected the source or drain electrode 180 or 181 through a contact hole 184 formed through the source or drain electrode 180 or 181, so as to form an OLED on the TFT.

In some embodiments, the first electrode 185 operates as an anode between electrodes included in the OLED, and may be formed of any one of various conductive materials. In some embodiments, the first electrode 185 may be a transparent electrode or a reflective electrode according to purpose.

For example, when the first electrode 185 is a transparent electrode, the first electrode 185 may be formed of indium tin oxide (ITO), indium zinc oxide (IZO), zinc oxide (ZnO), or indium oxide ($In_2O_3$), and when the first electrode 185 is a reflective electrode, the first electrode 185 may be formed by forming a reflective film by using Ag, Mg, Al, Pt, Pd, Au, Ni, Nd, Ir, Cr, or a compound thereof, and then forming ITO, IZO, ZnO, or $In_2O_3$ on the reflective film.

In some embodiments, a pixel-defining layer (PDL) 186 may be formed on the protective film 183 to cover an edge of the first electrode 185 of the OLED, wherein the PDL 186 is formed of an organic material. In some embodiments, an organic film 187 may be formed on an exposed region of the first electrode 185, which is formed by etching a part of the PDL 186.

In some embodiments, the organic film 187 may be patterned only according to sub-pixels, e.g., the first electrodes 185 in FIG. 2, but FIG. 2 illustrates for convenience the structure of a sub-pixel, and the organic film 187 may be integrally formed with an organic film 187 of an adjacent sub-pixel. In some embodiments, some organic films 187 may be formed according to sub-pixels and other organic films 187 may each be integrally formed with an organic film 187 of an adjacent sub-pixel.

In some embodiments, the organic film 187 may be formed of a low molecular weight organic material or a high molecular weight organic material.

When the organic film 187 is formed of a low molecular weight organic material, the organic film 187 may be formed in a single or complex structure of a hole injection layer (HIL), a hole transport layer (HTL), an emissive layer (EML), an electron transport layer (ETL), and an electron injection layer (EIL).

Examples of the low molecular weight organic material include copper phthalocyanine (CuPc), N,N'-Di(naphthalene-1-yl)-N,N'-diphenyl-benzidine (NPB), and tris-8-hydroxyquinoline aluminum (Alq3). In some embodiments, the low molecular weight organic material may be formed via vacuum deposition using masks.

When the organic film 187 is formed by using a high molecular weight organic material, the organic film 187 may include an HTL and an EML. In some embodiments, poly (3,4-Ethylenedioxythiophene) (PEDOT) may be used as the HTL and poly-phenylenevinylene (PPV)-based or polyfluorene-based high molecular weight organic material may be used as the EML. In some embodiments, the high molecular weight organic material may be formed via a screen printing or an inkjet printing method.

However, the organic film 187 is not limited to above, and any one of various embodiments may be applied.

In some embodiments, a second electrode 188 corresponding to a common electrode of the OLED may be formed on the organic film 187.

In some embodiments, the first electrode 185 and the second electrode 188 may be insulated from each other by the organic film 187. When voltages are applied to the first and second electrodes 185 and 188, visible rays are emitted from the organic film 187 to produce an image recognizable by a user.

Like the first electrode 185, the second electrode 188 may be a transparent electrode or a reflective electrode.

When the second electrode 188 is a transparent electrode, the second electrode 188 may be formed by depositing a metal having a low work function, such as lithium (Li), calcium (Ca), lithium fluoride (LiF)/Ca, LiF/Al, Aluminum (Al), magnesium (Mg), or a compound thereof, on the organic film 187, and then depositing a material for forming a transparent electrode, such as ITO, IZO, ZnO, or $In_2O_3$, thereon.

When the second electrode 188 is a reflective electrode, the second electrode 188 may be formed by depositing Li, Ca, LiF/Ca, LiF/Al, Al, Mg, or a compound thereof on the organic film 187.

While forming the first electrode 185 as a transparent electrode or a reflective electrode, the first electrode 185 may be formed in a shape corresponding to an opening of each sub-pixel. In some embodiments, the second electrode 188 may be formed by depositing a transparent electrode or a reflective electrode throughout a display region. However, the second electrode 188 may not be necessarily deposited throughout the display region, and may have any one of various patterns. In some embodiments, locations of the first and second electrodes 185 and 188 may be switched.

In some embodiments, the sealing unit 130 may be combined to the top of the OLED. In some embodiments, the sealing unit 130 may be formed to protect the organic film 187 and other thin layers from external moisture or oxygen. In some embodiments, the sealing unit 130 may seal the OLED, by first manufacturing the OLED and then forming an organic and/or inorganic film on the OLED. In some embodiments, the sealing unit 130 may be formed of the same material as the flexible substrate 171.

In some embodiments, a buffer layer (not shown) may be further formed on a surface of the sealing unit 130 facing the OLED. In some embodiments, the buffer layer may be formed of an inorganic material, such as $SiO_x$, $SiN_y$, SiON, AlO, or AlON, an organic material, such as acryl or PI, or both an inorganic material and an organic material that are stacked on each other.

Referring back to FIG. 1, the plurality of display units 120 that are spaced apart from each other on the mother substrate 110 may be cut to be separated.

In some embodiments, a plurality of cutting lines for individually separating the display units 120 are formed on the mother substrate 110 along the edges of the display units 120. In some embodiments, the cutting lines include a plurality of first cutting lines 161 formed along two facing edges of the display units 120 along the X-direction of the array substrate 100 and a plurality of second cutting lines 162 formed along the other two facing edges of the display units 120 along the Y-direction of the array substrate 100.

In some embodiments, the plurality of display units 120 continuously arranged in the X-direction may be separated according to groups by cutting the array substrate 100 along the first cutting lines 161 by using a cutting device, and again cutting the groups of the display units 120 along the second cutting lines 162 to obtain individual display units 120.

In some embodiments, at least one test wire line 140 may be formed on the wire regions 150 between the adjacent display units 120. Due to electric characteristics of increasing resistance by reducing a width, reducing of the width of the test wire line 140 is limited. Moreover, the space of the wire region 150 is limited for a light weight, thinness, and simplification.

In some embodiments, the test wire line 140 extends from the wire region 150 to the display unit 120. In some embodiments, the test wire line 140 overlaps the display unit 120 in the non-display region 122 of the display unit 120. In some embodiments, the first cutting line 161 or the second cutting line 162 on the mother substrate 110 may be located in the region where the test wire line 140 and the display unit 120 overlap each other.

As such, when the test wire line 140 overlaps the display unit 120, the test wire line 140 may be torn while the cutting device cuts the first or second cutting line 161 or 162 in a perpendicular direction. When the test wire line 140 is torn, a minute edge crack may be generated and the edge crack may proceed towards the display unit 120, and thus external moisture may penetrate into the display unit 120.

Accordingly, the display unit 120 may be defective, for example, the display unit 120 may shrink. Specifically, when the sealing unit 130, covering the display region 121 including an active area of the display unit 120, is damaged, the display unit 120 may quickly shrink. As a result, the display unit 120 may be damaged more.

Consequently, in some embodiments, the test wire line 140 has a pattern for preventing cracks.

This will now be described in detail.

Figure 3A:
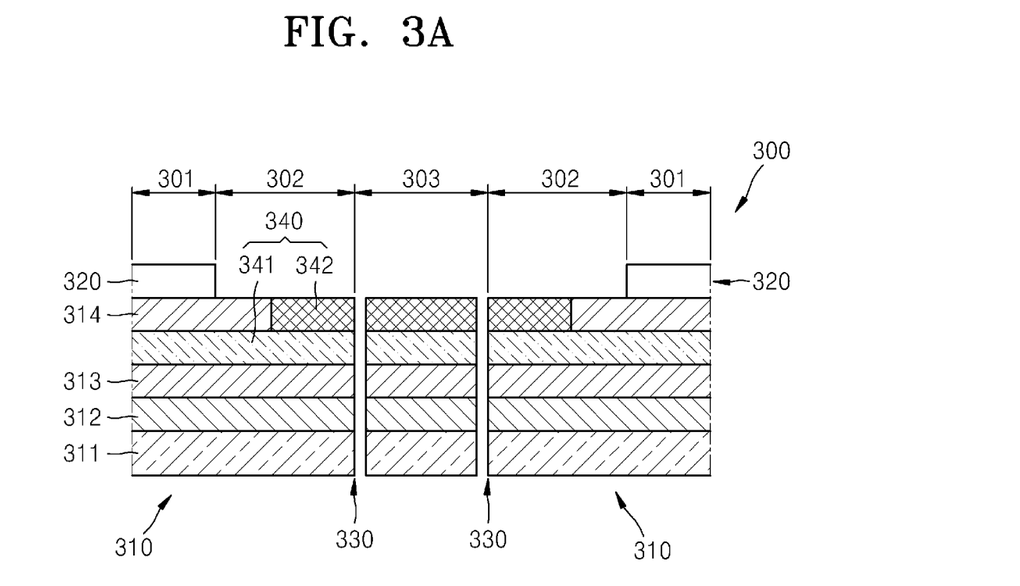
FIG. 3A is a cross-sectional view illustrating a test wire line according to an aspect of the present embodiments.
Figure 3B:
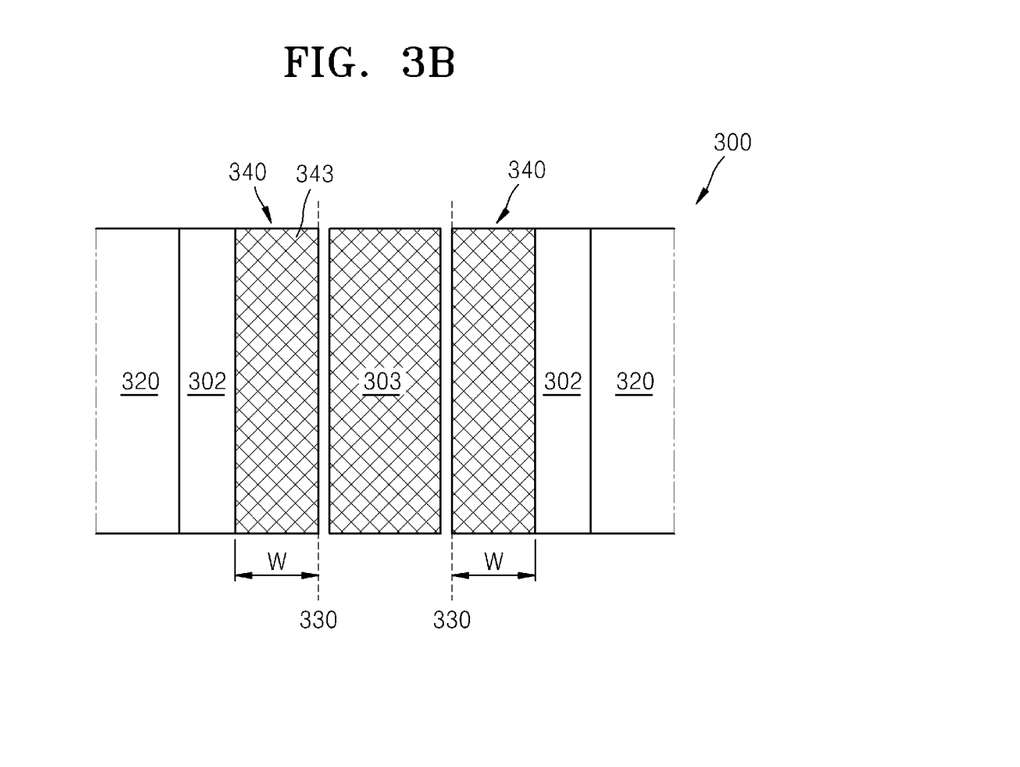
FIG. 3B is a plan view of FIG. 3A.

FIG. 3A is a cross-sectional view illustrating an array substrate 300 according to an embodiment of the present invention, and FIG. 3B is a plan view of FIG. 3A.

Here, a mother substrate included in an array substrate, which is described above, is not described, and only a region on the mother substrate where a display unit is formed, as described above with reference to FIGS. 1 and 2, is described.

Referring to FIGS. 3A and 3B, a plurality of display units 310 are arranged on the array substrate 300 along one direction. The display unit 310 includes a display region 301 and a non-display region 302 extending to an edge of the display unit 310. The display region 301 is covered by a sealing unit 320. A region between the adjacent display units 310 corresponds to a wire region 303.

In some embodiments, a TFT, a capacitor, a thin layer such as an OLED, and a plurality of insulation layers for insulating thin layers may be formed on a flexible substrate 311 in the display region 301 of the display unit 310. In some embodiments, at least one insulation layer extends from the display region 301 to the non-display region 302 and the wire region 303.

In some embodiments, a first insulation layer 312 corresponding to a barrier layer, a second insulation layer 313 corresponding to a gate insulation film, and a third insulation layer 314 corresponding to an interlayer insulation film may be sequentially stacked on a flexible substrate 311. Here, the first through third insulation layers 312 through 314 may be formed throughout the array substrate 300, or may be selectively formed in the non-display region 302 extending from the display region 301 and the wire region 303.

In addition, the structure of the first through third insulation layers 312 through 314 is not limited as long as at least one insulation layer is formed on the flexible substrate 311. In some embodiments, the barrier layer, the gate insulation film, and the interlayer insulation film, i.e., the first through third insulation layers 312 through 314, which insulate a semiconductor active layer, a gate electrode, and source and drain electrodes patterned on the flexible substrate 311, may be simultaneously formed for convenience.

In some embodiments, test wire lines 340 may be formed in the wire region 303. In some embodiments, the test wire line 340 may include a first wire line 341 and a second wire line 342. In some embodiments, the test wire line 340 may be arranged along one direction of the array substrate 300.

In some embodiments, the first wire line 341 may extend from the wire region 303 to the display unit 310. In some embodiments, the second wire line 342 may be stacked on the first wire line 341. In some embodiments, the test wire lines 340 may have a double layer structure of the first and second wire lines 341 and 342 so as to improve electric characteristics by reducing resistance of the test wire lines 340.

In some embodiments, the first wire line 341 may be simultaneously formed with a gate electrode formed in the display region 301. In some embodiments, the first wire line 341 may be formed on the second insulation layer 313 corresponding to the gate insulation film.

In some embodiments, the first wire line 341 extends from the display region 301 to the non-display region 302 and the wire region 303, but the structure of the first wire line 341 is not limited as long as the first wire line 341 overlaps the display unit 310 in the non-display region 302.

In some embodiments, the second wire line 342 may be simultaneously formed with source and drain electrodes formed in the display region 301. The first and second wire lines 341 and 342 may be formed of a material having excellent conductivity, such as Au, Ag, Cu, Ni, Pt, Pd, Al, Mo, or Cr.

In some embodiments, cutting lines 330 for individually separating the display units 310 from each other may be formed on the array substrate 300. In some embodiments, the cutting lines 330 may be formed at the edges of the display units 310, foe example, outside the display regions 301.

In some embodiments, the test wire lines 340 extend from the wire region 303 to the display unit 310, and overlap the display unit 310 in the non-display region 302 of the display unit 310.

In some embodiments, the cutting lines 330 may be formed in the overlapping regions to individually separate the display units 310, along the edges of the display units 310. In some embodiments, the cutting lines 330 may be located in the regions where the first and second insulation layers 312 and 313 overlap each other and where the first and second wire lines 341 and 342 overlap each other.

In some embodiments, the cutting lines 330 may be formed in such overlapping regions due to following reasons:

When the width of the test wire line 340 disposed in the wire region 303 is decreased, resistance is relatively increased, thereby deteriorating electric characteristics. Accordingly, reducing the width of the test wire line 340 is limited. The area of the non-display region 302 outside the display region 301 may be increased to prevent the overlap, but in this case, the area of the display unit 310 is unnecessarily increased. Accordingly, the cutting line 330 may be formed in the region where at least one of the first through third insulation layers 312 through 314 and the test wire line 340 overlap each other in the non-display region 302 of the display unit 310.

In this case, the test wire line 340 is torn while the cutting device cuts the cutting line 330 in a perpendicular direction. When the test wire line 340 is torn, a minute edge crack is generated and the minute edge crack proceeds towards the display unit 310 covered by the sealing unit 320. As a result, the sealing unit 320 is damaged, and the display unit 310 may shrink.

In order to prevent such shrinkage, the test wire line 340 has a predetermined pattern for preventing cracks. In some embodiments, at least one wire line of the test wire lines 340, for example, the second wire line 340, may have a mesh pattern 343.

In some embodiments, the mesh pattern 343 may be formed throughout the second wire line 323 along the wire region 303, but regions of the mesh pattern 343 are not limited as long as the regions include the non-display region 302 of the display unit 310 and a region W between the cutting lines 330.

In some embodiments, only the second wire line 342 that is exposed between the first and second wire lines 341 and 342 has the mesh pattern 343 for convenience of processes. In some embodiments, the first and second wire lines 341 and 342 may both have a mesh pattern.

As such, since the test wire lines 340 have the mesh pattern 343 for preventing cracks, a proceeding of an edge crack generated as the test wire line 340 is cut by the cutting device may be blocked by the mesh pattern 343. Accordingly, the edge crack does not proceed towards the display unit 310. Thus, the non-display region 302 extending from the display region 301 is protected from cracks.

Figure 4:
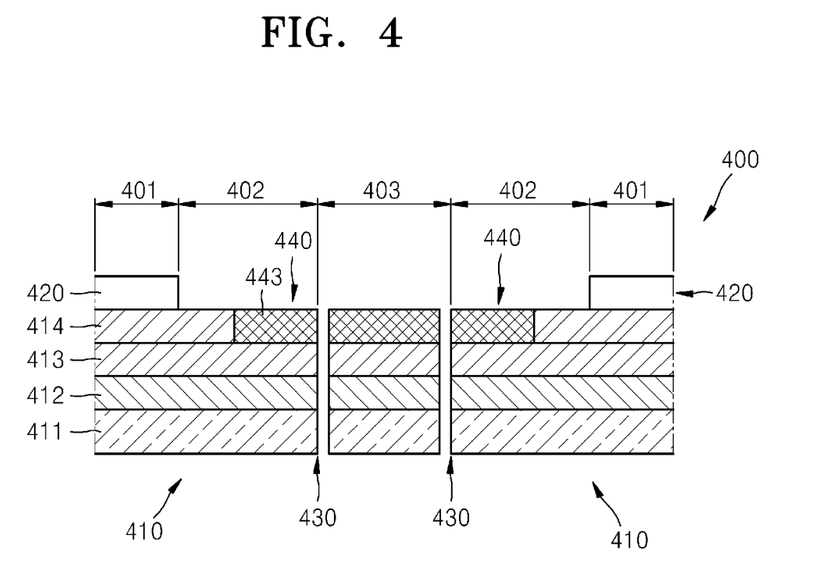
FIG. 4 is a cross-sectional view illustrating a test wire line according to another aspect of the present embodiments.

FIG. 4 is a cross-sectional view illustrating an array substrate 400 according to another embodiment of the present invention.

Referring to FIG. 4, a plurality of display units 410 are arranged along one direction of the array substrate 400. The display unit 410 includes a display region 401 and a non-display region 402 extending from the edge of the display region 401. The display region 401 is covered by a sealing unit 420. A region between the adjacent pair of display units 410 corresponds to a wire region 403.

In some embodiments, the display unit 410 may include a flexible substrate 411. In some embodiments, a first insulation layer 412 corresponding to a barrier layer, a second insulation layer 413 corresponding to a gate insulation film, and a third insulation layer 414 corresponding to an interlayer insulation film may be sequentially stacked on the flexible substrate 411. In some embodiments, the first through third insulation layers 412 through 414 may be formed throughout the array substrate 400 or at least one of the first through third insulation layers 412 through 141 may be selectively formed only in the non-display region 402 extending from the display region 401 and the wire region 403.

In some embodiments, test wire lines 440 may be formed in the wire region 403. In some embodiments, the test wire lines 440 may be disposed along one direction of the array substrate 400. In some embodiments, the test wire line 440 may be simultaneously formed with a gate electrode formed in the display region 401. In some embodiments, the test wire line 440 extends from the wire region 403 to the display unit 410, and overlaps the display unit 410 in the non-display region 402 of the display unit 410. In some embodiments, the test wire line 440 may be formed on the second insulation layer 413.

In some embodiments, cutting lines 430 may be formed on the array substrate 400. In some embodiments, the cutting lines 430 may be formed in regions where the first and second insulation layers 412 and 413 and the test wire line 440 overlap each other.

Here, the test wire line 440 has a predetermined pattern to prevent cracks. In some embodiments, the test wire lines 440 have a mesh pattern 443. Accordingly, an edge crack generated in the cutting line 430 during a cutting process may be interfered from proceeding by the test wire lines 440 having the mesh pattern 443.

Figure 5:
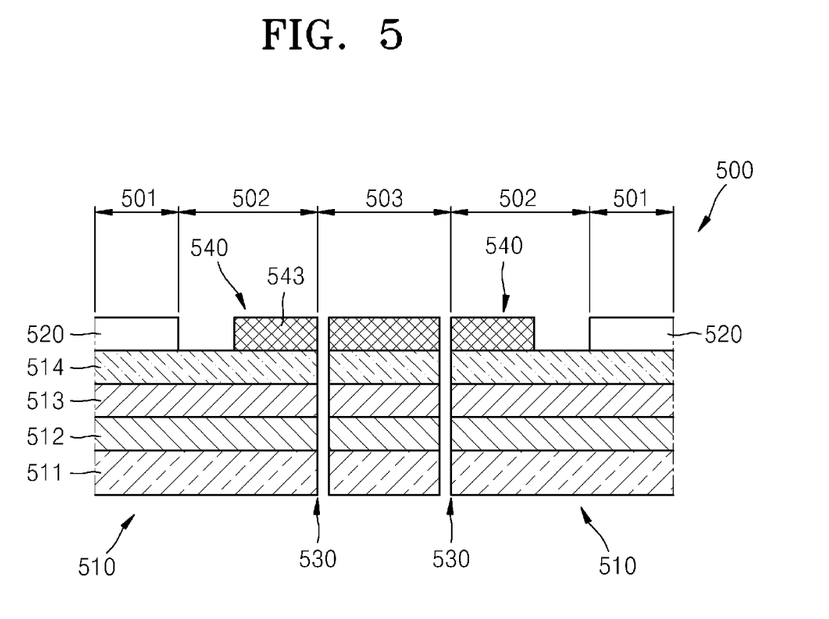
FIGS. 5 through 7 are cross-sectional views illustrating test wire lines according to another aspect of the present embodiments.

FIG. 5 is a cross-sectional view illustrating an array substrate 500 according to another embodiment of the present invention.

Referring to FIG. 5, a plurality of display units 510 are arranged on the array substrate 500. The display unit 510 includes a display region 501 and a non-display region 502. The display region 501 is covered by a sealing unit 520. A region between a pair of adjacent display units 510 corresponds to a wire region 503.

The display unit 510 includes a flexible substrate 511. A first insulation layer 512 corresponding to a barrier layer, a second insulation layer 513 corresponding to a gate insulation film, and a third insulation layer 514 corresponding to an interlayer insulation film are sequentially stacked on the flexible substrate 511. In some embodiments, the first through third insulation layers 512 through 514 may be formed throughout the array substrate 500 or at least one of the first through third insulation layers 512 through 514 may be selectively formed only on the non-display region 502 extending from the display region 501 and the wire region 503.

Test wire lines 540 are formed in the wire region 503. In some embodiments, the test wire lines 540 may be simultaneously formed with source and drain electrodes formed in the display region 501. The test wire line 540 extends from the wire region 503 to the display unit 510, and overlaps the display unit 510 in the non-display region 502 of the display unit 510. The test wire line 540 is formed on the third insulation layer 514.

Cutting lines 530 are formed on the array substrate 500. The cutting line 530 is formed in a region where the first through third insulation layers 512 through 514 and the test wire line 540 overlap in the non-display region 502.

In some embodiments, the test wire line 540 has a predetermined pattern, for example, a mesh pattern 543. Thus, an edge crack generated during a cutting process may be prevented by the mesh pattern 543.

Figure 6:
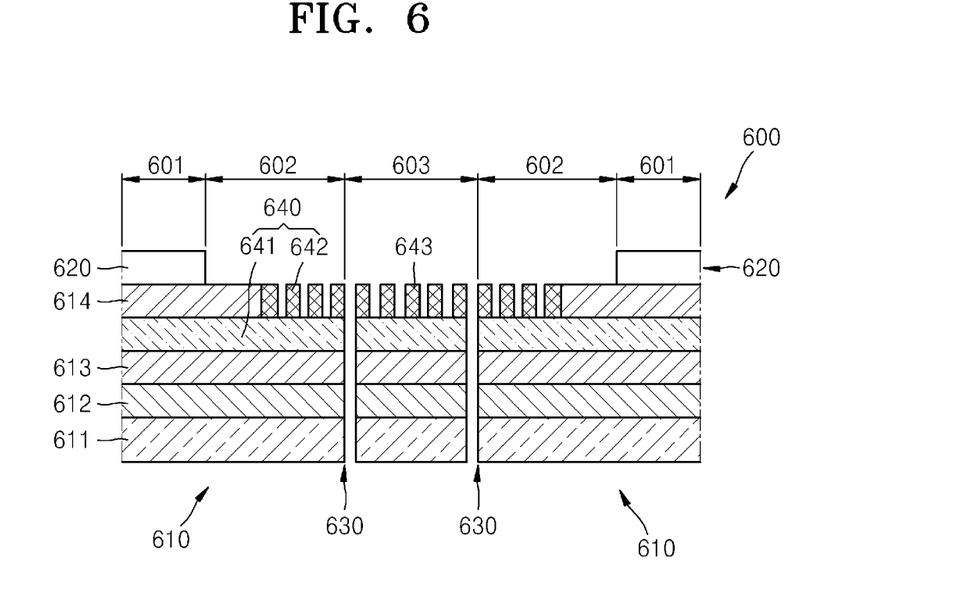

FIG. 6 is a cross-sectional view illustrating an array substrate 600 according to another embodiment of the present invention.

Referring to FIG. 6, a plurality of display units 610 are arranged on the array substrate 600. The display unit 610 includes a display region 601 and a non-display region 602. The display region 601 is covered by a sealing unit 620. A region between a pair of adjacent display units 610 corresponds to a wire region 603.

The display unit 610 includes a flexible substrate 611. A first insulation layer 612 corresponding to a barrier layer, a second insulation layer 613 corresponding to a gate insulation film, and a third insulation layer 614 corresponding to an interlayer insulation film are sequentially stacked on the flexible substrate 611.

Test wire lines 640 are formed in the wire region 603. The test wire line 640 includes a first wire line 641 and a second wire line 642. The first wire line 641 extends from the wire region 603 to the display unit 610. The second wire line 642 is stacked on the first wire line 641.

In some embodiments, the first wire line 641 is simultaneously formed with a gate electrode, and the second wire line 642 is simultaneously formed with source and drain electrodes. The first wire line 641 is formed on the second insulation layer 613. The test wire line 640 extends from the wire region 603, and overlaps the display unit 610 in the non-display region 602 of the display unit 610.

Cutting lines 630 for individually separating the display unit 610 from each other are formed along the edges of the display unit 610 in the overlapping regions.

In some embodiments, at least one of the test wire lines 640, for example, the second wire line 642, has a predetermined pattern 643 for preventing cracks. In some embodiments, the predetermined pattern 643 may be a plurality of stripe or mesh patterns spaced apart from each other, but is not limited thereto. Accordingly, when an edge crack is generated during a cutting process, the predetermined pattern 643 may prevent proceeding of the edge crack and operate as a buffer of the edge crack.

Figure 7:
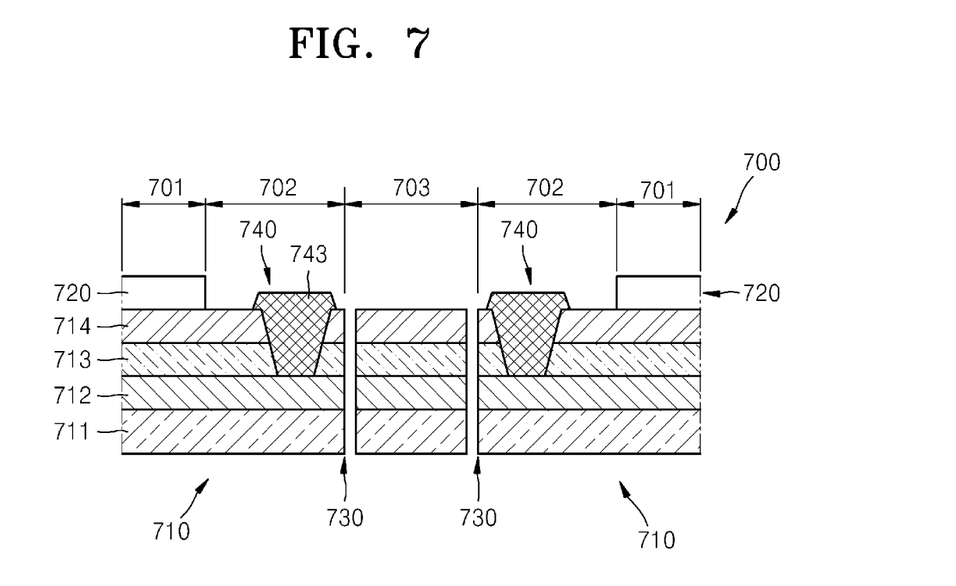

FIG. 7 is a cross-sectional view illustrating an array substrate 700 according to another embodiment of the present invention.

Referring to FIG. 7, a plurality of display units 710 are arranged on the array substrate 700. The display unit 710 includes a display region 701 and a non-display region 702. The display region 701 is covered by a sealing unit 720. A region between a pair of adjacent display units 610 corresponds to a wire region 703.

The display unit 610 includes a flexible substrate 711. A first insulation layer 712 corresponding to a barrier layer, a second insulation layer 713 corresponding to a gate insulation film, and a third insulation layer 714 corresponding to an interlayer insulation film are sequentially stacked on the flexible substrate 711.

Test wire lines 740 are formed in the wire region 703. In some embodiments, the test wire lines 740 may be simultaneously formed with source and drain electrodes formed in the display region 701. In some embodiments, the test wire lines 740 have a predetermined pattern, for example, a mesh pattern 743.

In some embodiments, a contact hole 751 may be formed by removing a part of the second insulation layer 713 and a part of the third insulation layer 714. In some embodiments, the contact hole 751 may be formed to embed the test wire lines 740 having the mesh pattern 743.

Accordingly, the test wire lines 740 are strongly combined to the second and third insulation layers 713 and 714, and even when an edge crack is generated while cutting a cutting line 730, proceeding of the edge crack may be easily blocked.

Some embodiments provide a flexible display device including a test wire line having a pattern that prevents cracks, and thus an edge crack generated at an edge of a display unit may be prevented from proceeding to the display unit. Accordingly, shrinkage of the display unit may be prevented.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. An array substrate for a flexible display device, the array substrate comprising:
   a mother substrate;
   a plurality of display units that are spaced apart from each other on the mother-substrate, the plurality of display units each comprising a display region for displaying an image and a non-display region extending from the display region;
   a sealing unit covering the display region of each of the plurality of display units;
   a plurality of test wire lines formed in a wire region between the adjacent display units on the mother substrate, that are electrically connected to each of the plurality of display units, wherein each test wire line is made up of a pattern, the pattern configured for preventing cracks, wherein the pattern is a mesh type pattern, wherein the plurality of test wire lines are arranged along one direction of the mother substrate, and wherein the plurality of test wire lines overlap the plurality of display units in the non-display regions of the plurality of display units by extending from the wire region to each of the plurality of display units; and
   a plurality of cutting lines for individually separating the plurality of display units, wherein the plurality of cutting lines are formed on the mother substrate along edges of the plurality of display units, wherein the plurality of cutting lines are formed in regions where the plurality of test wire lines and the plurality of display units overlap.

2. The array substrate of claim 1, further comprising at least one insulation layer, wherein the at least one insulation layer is formed on the mother substrate in the non-display region of each of the plurality of display units, and wherein the plurality of cutting lines are located on regions where at least one region of the at least one insulation layer and the plurality of test wire lines overlap.

3. The array substrate of claim 1, wherein the plurality of display units each comprise:
   a flexible substrate formed on the mother substrate;
   a thin film transistor formed on the flexible substrate, wherein the thin film transistor comprises a semiconductor active layer, a gate electrode, source and drain electrodes, and a plurality of insulation layers insulating devices from each other; and
   an organic light-emitting device connected to the thin film transistor, wherein the organic light-emitting device comprises a first electrode, a second electrode, and an organic film formed between the first and second electrodes.

4. The array substrate of claim 3, wherein the plurality of insulation layers each extend from the display regions of the plurality of display units where the devices are formed to the non-display regions and wire regions, and wherein the plurality of test wire lines are formed on the plurality of insulation layers.

5. The array substrate of claim 4, further comprising a plurality of cutting lines for individually separating the plurality of display units from each other, wherein the plurality of cutting lines are formed on edges of the plurality of display units, wherein the plurality of test wire lines extend from wires to the plurality of display units to overlap the plurality of display units in the non-display regions of the plurality of display units, and wherein the plurality of cutting lines are formed in regions where the plurality of test wire lines and the plurality of display units overlap each other.

6. The array substrate of claim 4, wherein the plurality of insulation layers each comprise:
   a first insulation layer corresponding to a buffer layer formed on the flexible substrate;
   a second insulation layer corresponding to a gate insulation film covering the semiconductor active layer formed on the first insulation layer; and
   a third insulation layer corresponding to an interlayer insulation film covering the gate electrode formed on the second insulation layer.

7. The array substrate of claim 6, wherein the plurality of test wire lines each comprise:
   a first wire line formed on the second insulation layer; and
   a second wire line stacked on the first wire line.

8. The array substrate of claim 6, wherein the plurality of test wire lines each comprise a wire line formed on the second insulation layer.

9. The array substrate of claim 6, wherein the plurality of test wire lines each comprise a wire line formed on the third insulation layer.

10. The array substrate of claim 6, wherein the plurality of test wire lines each comprise a wire line formed on the second insulation layer and in a contact hole penetrating through the third insulation layer.

* * * * *